United States Patent [19]

Freeman et al.

[11] Patent Number: 4,508,610

[45] Date of Patent: Apr. 2, 1985

[54] METHOD FOR MAKING THIN FILM ELECTROLUMINESCENT RARE EARTH ACTIVATED ZINC SULFIDE PHOSPHORS

[75] Inventors: Eva C. Freeman, Lincoln; Donald H. Baird, Newton, both of Mass.

[73] Assignee: GTE Laboratories Incorporated, Waltham, Mass.

[21] Appl. No.: 584,178

[22] Filed: Feb. 27, 1984

[51] Int. Cl.³ .............................................. C23C 15/00
[52] U.S. Cl. ............................ 204/192 P; 204/192 R; 252/301.6 S; 313/503; 427/42
[58] Field of Search ...................... 204/192 P, 192 R; 252/301.6 S; 313/503

[56] References Cited

U.S. PATENT DOCUMENTS 3,803,438  4/1974  Hanak ................................ 204/192 P
4,279,726  7/1981  Baird et al. ....................... 204/192 P
4,389,295  6/1983  Davey et al. ..................... 204/192 R

OTHER PUBLICATIONS

Hanak, Proc. 6th Intern. Vacuum Cong., (Jap.), J. Appl. Phys., Suppl. 2, Pt. 1, (1974), pp. 809–812.
Tuenge et al., Electrochem. Soc. 1981, Spring Meeting, pp. 425–427.
Okamoto, Appl. Phys. Lett., 35, (1979), pp. 508–511.
Freeman et al., Phys. Rev. B., 20, (1979), pp. 716–728.
Chase, J. App. Phys., 40, (1969), pp. 2512–2519.

*Primary Examiner*—Arthur P. Demers
*Attorney, Agent, or Firm*—Ivan L. Ericson

[57] ABSTRACT

A method of coactivating a rare earth activated, electroluminescent zinc sulfide film with activator gas is described. The phosphor film is deposited upon a substrate by co-sputtering from a zinc sulfide target and a rare earth target in an atmosphere such as hydrogen, chlorine, fluorine or bromine, and an inert gas.

10 Claims, No Drawings

METHOD FOR MAKING THIN FILM ELECTROLUMINESCENT RARE EARTH ACTIVATED ZINC SULFIDE PHOSPHORS

The Government has rights in this invention pursuant to Contract No. DAAK20-82-C-0385 awarded by U.S. Army Electronics Research and Development Command.

FIELD OF THE INVENTION

This invention relates to a method for making an electroluminescent material. More particularly, this invention relates to a method for making rare earth activated zinc sulfide electroluminescent phosphor film.

BACKGROUND OF THE INVENTION

Electroluminescent thin film phosphors of various emission colors can be prepared by activating a zinc sulfide film with an appropriate rare earth element. Terbium is a frequently used rare earth since, in a zinc sulfide film, it can produce a high brightness green emission. Samarium in zinc sulfide produces a potentially useful red emission while other rare earths can yield various other colors. These rare earth elements are normally stable in the trivalent state. They are therefore not readily accommodated as direct substituents for divalent zinc in zinc sulfide. It is necessary to provide some form of charge compensation and this is desirably done by putting in an additional additive, often called a coactivator. Thus, in evaporative deposition methods, the usual source for rare earth elements to be used as activators in zinc sulfide films is the fluoride (e.g., $TbF_3$) since then enough fluorine can be taken into the film structure to satisfy the trivalent bonding requirement of the rare earth. In this case, fluorine serves as the coactivator. It is also possible to use the rare earth element itself as the source with no coactivator. In this case, it is probable that the deviation in the valence of the rare earth is accommodated by zinc vacancies or other structural defects. Such films are generally less bright and less uniform electroluminescent emitters than those prepared using the fluoride source. They also tend to have poor dielectric properties.

In the case of sputtered zinc sulfide films, the situation is similar. Terbium can be added by sputtering simultaneously either from terbium fluoride and zinc sulfide targets or from terbium and zinc sulfide targets. As in the case of films prepared by evaporative methods, the emission is brighter and more uniform and the dielectric properties better in films prepared using the fluoride target. The same is true of other rare earths used as additives to zinc sulfide. A disadvantage in the use of such fluoride targets, however, is that they cannot be melted and cast but must be pressed from a powder. They are typically quite fragile and subject to easy breakage. It is therefore desirable to find alternative ways of adding coactivator during film deposition by sputtering techniques such that the rare earth itself can be used in the form of a metallic target.

SUMMARY OF THE INVENTION

In accordance with one aspect of the present invention, a new and improved method is described for making a zinc sulfide electroluminescent thin film phosphor.

The first step (A) in the method comprises evacuating a sputtering chamber which contains a substrate, a zinc sulfide sputtering target, and a rare earth sputtering target to a pressure suitable for sputtering. The second step (B) comprises adding to the sputtering chamber a fill gas comprising an inert gas and hydrogen. The hydrogen is from about one to about 40 volume percent of the fill gas. The fill gas is held at a pressure from about $7 \times 10^{-2}$ Torr. The third step (C) comprises co-sputtering from the zinc sulfide sputtering target and from the rare earth sputtering target in the fill gas held at the pressure from step (C) to form a thin film zinc sulfide electroluminescent phosphor on the substrate.

In accordance with another aspect of the present invention, a new and improved method is described for making a zinc sulfide electroluminescent thin film phosphor.

The first step (A) in the method comprises evacuating a sputtering chamber which contains a substrate, a zinc sulfide sputtering target, and a rare earth sputtering target to a pressure suitable for sputtering. The second step (B) comprises adding to the sputtering chamber a fill gas comprising an inert gas and an activator gas. The activator gas is from about 0.1 to about 1.7 volume percent of the fill gas. The activator gas is selected from the group consisting of chlorine, fluorine, bromine and mixtures thereof. The fill gas is held at a pressure from about $7 \times 10^{-3}$ to about $10^{-2}$ Torr. The third step (C) comprises co-sputtering from the zinc sulfide sputtering target and from the rare earth sputtering target in the fill gas held at the pressure from step (C) to form a thin film zinc sulfide electroluminescent phosphor on the substrate.

For a better understanding of the present invention, together with other and further objects, advantages and capabilities thereof, reference is made to the following disclosure and appended claims.

DETAILED DESCRIPTION OF THE PREFERRED EMBODIMENTS

An improved method for coactivating a terbium activated zinc sulfide film was accomplished by adding either hydrogen or chlorine to the gas in which the sputtering process is carried out. These additives give effects similar to those found when a rare earth fluoride is used as the target material since they can be taken up by the growing film to satisfy the valence requirements of the rare earth. In addition, fluorine or bromine can be used instead of hydrogen or chlorine.

Experiments were carried out employing either terbium or samarium as the rare earth activator in the form of a metal sputtering target with either hydrogen or chlorine as the coactivator by using one of these gases mixed with an inert gas, such as argon, as the sputtering fill gas. The desirable effects cited above were obtainable with hydrogen over the entire range of fill gas compositions tested of 10 to 30 percent hydrogen by volume. In view of this the range of useful compositions should be considered to be 1 to 40 percent.

In the case of chlorine, effects were seen at concentrations from 0.1 to 1.7 volume percent. However, at the upper end of this range, the apparent presence of excess chlorine in the film gave rise to peeling. Therefore, the recommended range is 0.1 to 1.0 volume percent for this coactivator. In all these experiments, the total pressure of the sputtering fill gas was in the range of $7 \times 10^{-3}$ to $10^{-2}$ Torr.

The practice of this invention is illustrated by the following example of device fabrication employing a terbium activated hydrogen coactivated (ZnS:Tb:H) film. A three target sputtering system was used (as described in U.S. Pat. No. 4,279,726). In the device, the light-emitting phosphor layer is combined with one or more insulating films to form the ac EL device. Any of a variety of insulating materials can be used for this purpose. In this illustration, a film of aluminum oxide on either side of the phosphor was used.

The glass substrate carrying a suitably patterned transparent conductive film was cleaned and placed in the sputtering chamber which was equipped with aluminum, zinc sulfide, and terbium sputtering targets and the system pumped down. The first insulating layer of aluminum oxide was deposited by sputtering from the aluminum target in an oxygen atmosphere at a pressure of $7.7 \times 10^{-3}$ torr for three hours at a power level of 450 W. The light-emitting phosphor layer was then deposited by co-sputtering from the zinc sulfide and terbium targets in a fill gas atmosphere consisting of 30 percent by volume hydrogen and 70 percent by volume argon at a total pressure of $7.2 \times 10^{-3}$ torr. The total power was 600 W and was so divided between the targets that the voltage on the ZnS was 1.6 kV and that on the terbium was 210 V. After a 25 minute presputtering period, deposition was carried out for two hours 40 minutes. A second aluminum oxide layer was then deposited under essentially the same conditions as the first. The device was completed by evaporating an appropriately patterned counter-electrode of aluminum. After a heat treatment of one-half hour at 450° C. in argon, the brightness-voltage curve was measured under 1 kHz sine wave excitation and is shown in the following table:

| Brightness-Voltage Table 1.kHz sine wave excitation | |
| --- | --- |
| Volts (rms) | Brightness (footlamberts) |
| 129 | 0.1 |
| 130 | 0.2 |
| 135 | 0.5 |
| 139 | 1.0 |
| 143 | 2.0 |
| 148 | 5.0 |
| 154 | 10.0 |
| 163 | 20.0 |
| 175 | 30.0 |
| 190 | 40.0 |
| 210 | 51.0 |
| 223 | 57.2 |

Accordingly, while there has been shown and described what are at present considered the preferred embodiments of the invention, it will be obvious to those skilled in the art that various changes and modifications may be made therein without departing from the scope of the invention as defined by the appended claims.

What is claimed is:
1. A method of making a zinc sulfide electroluminescent thin film phosphor comprising the steps of:
   (A) evacuating a sputtering chamber to a pressure suitable for sputtering, said sputtering chamber containing a substrate, a zinc sulfide sputtering target, and a rare earth sputtering target;
   (B) adding to said sputtering chamber from step (A) a fill gas comprising an inert gas and hydrogen, said hydrogen being from about one to about 40 volume percent of said fill gas, said fill gas being held at a pressure from about $7 \times 10^{-3}$ to about $10^{-2}$ Torr;
   (C) co-sputtering from said zinc sulfide sputtering target and from said rare earth sputtering target in said fill gas held at said pressure to form a thin film zinc sulfide electroluminescent phosphor on said substrate.

2. A method in accordance with claim 1 wherein said hydrogen is from about 10 to about 30 volume percent.

3. A method in accordance with claim 1 wherein said rare earth is selected from the group consisting of terbium, samarium, and combinations thereof.

4. A method in accordance with claim 1 wherein said inert gas is argon.

5. A method of making zinc sulfide electroluminescent thin film phosphor comprising the steps of:
   (A) evacuating a sputtering chamber to a pressure of suitable for sputtering, said sputtering chamber containing a substrate, a zinc sulfide sputtering target, and a rare earth sputtering target;
   (B) adding to said sputtering chamber from step (A), a fill gas comprising an inert gas and an activator gas, said activator gas being from about 0.1 to about 1.7 volume percent of said fill gas, said activator gas being selected from the group consisting of chlorine, fluorine, bromine, and mixtures thereof, said fill gas being held at a pressure from about $7 \times 10^{-3}$ to about $10^{-2}$ Torr;
   (C) co-sputtering from said zinc sulfide sputtering target and from said rare earth sputtering target in said fill gas held at said pressure to form a thin film zinc sulfide electroluminescent phosphor on said substrate.

6. A method in accordance with claim 5 wherein the said activator gas is from about 0.1 to about 1.0 volume percent.

7. A method in accordance with claim 1 wherein said rare earth is selected from the group consisting of terbium, samarium, and combinations thereof.

8. A method in accordance with claim 1 wherein said inert gas is argon.

9. A zinc sulfide electroluminescent thin film phosphor, made in accordance with the method of claim 1.

10. A zinc sulfide electroluminescent thin film phosphor made in accordance with the method of claim 5.

* * * * *